(12) United States Patent
Krivokapic

(10) Patent No.: US 6,297,111 B1
(45) Date of Patent: *Oct. 2, 2001

(54) SELF-ALIGNED CHANNEL TRANSISTOR AND METHOD FOR MAKING SAME

(75) Inventor: Zoran Krivokapic, Santa Clara, CA (US)

(73) Assignee: Advanced Micro Devices, Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/914,986

(22) Filed: Aug. 20, 1997

(51) Int. Cl.$^7$ ................................................... H01L 21/336
(52) U.S. Cl. .................... 438/302; 438/289; 438/525; 438/585
(58) Field of Search ..................... 438/302, 299, 438/300, 301, 303, 305, 525, 526, 289, 290, 291, 282, 585, 592, FOR 188; 257/402, 403

(56) References Cited

U.S. PATENT DOCUMENTS

| | | | |
|---|---|---|---|
| 4,282,648 | 8/1981 | Yu et al. ................................. | 29/571 |
| 4,366,613 | 1/1983 | Ogura et al. ............................ | 29/571 |
| 4,590,663 | 5/1986 | Haken .................................... | 29/571 |
| 4,764,478 | * 8/1988 | Hiruta .................................... | 438/585 |
| 5,217,910 | * 6/1993 | Shimizu et al. ....................... | 438/231 |
| 5,257,095 | 10/1993 | Liu et al. ............................... | 257/315 |
| 5,372,957 | * 12/1994 | Liang et al. ........................... | 438/302 |
| 5,395,778 | 3/1995 | Walker .................................. | 438/265 |
| 5,409,848 | * 4/1995 | Han et al. ...................... | 148/DIG. 18 |
| 5,413,949 | * 5/1995 | Hong ..................................... | 438/291 |
| 5,466,957 | 11/1995 | Yuki et al. ............................. | 257/344 |
| 5,512,498 | * 4/1996 | Okamoto ............................... | 438/302 |
| 5,518,941 | * 5/1996 | Lin et al. ............................... | 438/302 |
| 5,532,176 | * 7/1996 | Katada et al. ......................... | 437/34 |
| 5,534,449 | * 7/1996 | Dennison et al. .................... | 438/302 |
| 5,734,185 | * 3/1998 | Iguchi et al. .......................... | 257/336 |
| 5,817,536 | * 10/1998 | Nayak et al. .......................... | 438/530 |

FOREIGN PATENT DOCUMENTS

| | | | |
|---|---|---|---|
| 6-349854 | * 12/1994 | (JP) . | |
| 6-350040 | * 12/1994 | (JP) . | |
| 9-64361 | * 3/1997 | (JP) ............................. | 438/FOR 188 |

OTHER PUBLICATIONS

Y. Momiyama et al., Channel Engineering of 0.13 $\mu$m nMOSET for 1.0 V CMOS Using Gate Poly–Si Oxidation and Laterally Profiled, Surface Concentrated Channel Technologies, IEEE, 1998 Symposium on VLSI Technology Digest of Technical Papers, pp. 78–79.

Y. Momiyama et al., Indium Tilted Channel Implantation Technology for 60 nm nMOSFET, IEEE, Proceedings of the 1999 VLSI Technology Symposium, pp. 467–68.

Odanaka, et al., "Potential Design and Transport Property of 0.1–$\mu$m MOSFET with Asymmetric Channel Profile," IEEE Transactions on Electron Devices, vol. 44, No. 4 (Apr. 1997).

Ogura, et al., "Design and Characteristics of the Lightly Doped Drain–Source (LDD) Insulated Gate Field–Effect Transistor," IEEE publication, copyright 1980.

* cited by examiner

Primary Examiner—Michael Trinh
(74) Attorney, Agent, or Firm—Fliesler, Dubb, Meyer & Lovejoy LLP

(57) ABSTRACT

A method for forming a transistor comprises the steps of: forming a gate stack on the surface of a semiconductor substrate; implanting a first dose of an impurity into the substrate at a sufficient energy to penetrate at least a portion of the gate stack to provide a portion of the impurity on the first and second sides of the gate stack, and a portion of the impurity under the gate stack; and forming source/drain regions on the first and second sides of the gate stack. The implant may be at an angle normal to the surface of the substrate at an energy sufficient such that the impurity penetrates the gate stack to reach the channel region. Alternatively, a pair of angled implants at an angle relative to a line normal to the surface of the substrate may be used.

1 Claim, 5 Drawing Sheets

SELF-ALIGNED CHANNEL TRANSISTOR AND METHOD FOR MAKING SAME

BACKGROUND OF THE INVENTION

1. Field of the Invention

The invention relates to a transistor structure, specifically a self-aligned channel transistor, and a process for forming a self-aligned channel transistor.

2. Description of the Related Art

With the continuing quest to define and produce transistors having ever-smaller overall cell geometries that are capable of operating at increasing switching speeds, many variations on the conventional self aligned channel region have been attempted. For the purposes of this application, cell geometry is defined as the two-dimensional surface area required for implementing a single, integral active lodging element, typically an N- or P-channel resistor or a pair of complementary transistors. Cell geometry can be distinguished from transistor geometry in that the latter refers to the three-dimensional structure of a single integral logic element.

A great deal of time and effort has been spent on producing the so-called LIGHTLY DOPED DRAIN-SOURCE (LDD) semiconductor device, wherein shallow extension regions at the gate oxide/substrate interface closest to the point within the transistor where a large degree of electric field strength occurs. Typically, these extension regions are provided adjacent to the source or drain (referred to collectively herein as the "active" regions) in a typical semiconductor device.

The typical LDD structure involves providing narrow, self-aligned—lightly-doped regions between the device channel and more heavily doped source-drain diffusions in the device. It has been repeatedly shown that significant improvement in breakdown voltages, hot electron effects, and short channel threshold effects can be achieved using LDD regions, thereby allowing transistor operation at higher voltages and shorter channel lengths. Indeed, LDD technology is extremely advantageous in sub-micron channel length devices.

Typical devices constructed with LDD regions are shown in Ogura, et al. titled "Design and Characteristics of the Lightly Doped Drain-Source (LDD) Insulated Gate Field-Effect Transistor", IEEE publication, copyright 1980, and U.S. Pat. Nos. 5,257,095, 4,590,663, 4,282,648, and 4,366,613.

Angled implantation has been attempted as a solution to forming shorter channel length devices.

In the quarter-micron regime, asymmetric n-channel MOSFET devices have been proposed to achieve high current drive-ability and hot-carrier reliability. In a paper by Odanaka, et al., entitled "Potential Design and Transport Property of 0.1-$\mu$m MOSFET with Asymmetric Channel Profile," IEEE Transactions on Electron Devices, Vol. 44, No. 4(April 1997), the authors describe the exploration of the relationship between device performance and transport property of a 0.1 $\mu$m n-channel MOSFET with an asymmetric channel profile through Monte Carlo device simulations and measured electrical characteristics.

The experimental device taught therein has a gate oxide thickness of 4 nanometers and a polysilicon gate height of 200 nanometers. Processing of the device is equivalent to that of a conventional symmetrical device, except that the $V_t$ channel implant, which is utilized to adjust the threshold voltage of the device, is performed by a threshold adjustment implantation with an orientation non-normal to the surface of the substrate after gate electrode formation. For such a channel implant, an 80 KeV BF2 ion dose of $1\times10^{13}$ cm–2 is implanted with a tilt angle of 7°. Of note is that this implant is on the source side only of the devices, and no masking of the device during the $V_t$ implant is discussed. The reference teaches that the asymmetry of the lateral channel profile becomes weak as the BF2 energy decreases. After gate electrode formation, arsenic ions with a dose of $1\times10^{14}$ cm–2 were implanted at an energy of 10 KeV to form shallow source/drain extensions. Subsequently, deep source/drain regions are formed with a high arsenic dose of $6\times10^{15}$ cm–2 at an energy of 40 KeV, followed by a rapid thermal anneal at 1,050° C. for ten seconds.

In a symmetrical short channel MOSFET, a number of implants are used to control the $V_t$ threshold voltage. In particular, a substrate will typically have formed thereon an epitaxial silicon layer overlying the bulk silicon layer of the semiconductor substrate.

A shallow implant of, for example, a P-type impurity such as boron or $BF_2$ will be implanted into the channel region wherein the device is to be formed. The energy of the implant will be in a range of about 10–30 KeV to a depth of about 100 $\mu$m.

Subsequently, a punch-through stop implant at an energy of about 40–100 KeV to a junction depth of about 0.25 $\mu$m will be made into the epitaxial silicon. This pushes dopants further down into the substrate and increases the resistance of the channel.

Finally, a third, approximately 200 KeV implant may be used in addition to form a deep punch-through stop implant for the symmetrical channel device.

Another alternative has been attempted in co-pending application (Ser. No. 08/481,895, U.S. Pat. No. 5,935,867, inventors Alvis, Luning, and Griffin) wherein a process for forming a shallow doped region in a semiconductor device is disclosed. The device includes active regions, such as a source and a drain region provided in a semiconductor substrate, and the shallow doped region may comprise a lightly doped drain region. The method comprises implanting into the substrate a source and a drain region about the gate structure at an angle greater than 0 degrees with respect to the surface normal to the substrate. In this application the angled implant is designed to be on one side of the gate and penetrate the gate to allow for a varied implant region on the other side of the implant.

Angled implants on both sides of the gate structure are demonstrated in U.S. Pat. No. 5,466,957 issued to Yuki, et al. Yuki et al. uses standard well implants (three total) to achieve lighter channel doping by counter-doping the channel region with an impurity having a conductivity opposite to that of the channel. This approach may be good in the case of hot carrier injection problems but has the consequence of degrading mobility and increasing junction capacitances.

SUMMARY OF THE INVENTION

The invention, roughly described, comprises a method for forming a self-aligned channel transistor.

In one embodiment, the method comprises the steps of: forming a gate stack on the surface of a semiconductor substrate; forming a mask layer over the surface of the substrate, the mask layer having an opening over the gate stack and over a first and second portions of the substrate at a respective first and second sides of the gate stack; implanting a first dose of an impurity into the substrate at a sufficient energy to penetrate at least a portion of the gate stack to provide a portion of the impurity on the first and second sides of the gate stack, and a portion of the impurity under the gate stack; and forming source/drain regions on the first and second sides of the gate stack.

In a further aspect, the implant step may comprise the steps of: implanting a first dose of an impurity into the substrate at a first angle relative to a line normal to the surface of the substrate in a range of about 5° to 40°; and implanting a second dose of the impurity into the substrate at a second angle relative to a line normal to the surface of the substrate, the angle being in a range of about −5° to −40°.

In one embodiment, the implantation step comprises implanting boron at an energy of 25–70 KeV, and in an alternative embodiment, comprises implanting phosphorous at an energy of about 200 KeV.

In a further embodiment, the angles of implantation are 30°, and −30°, respectively.

In yet another embodiment of the present invention, the gate stack includes a barrier layer, such as an oxinitride or silicon nitride, to shield the majority of the gate stack from the implantation steps.

In still another embodiment of the present invention, a conformal spacer layer is formed over the surface of the gate stack and the surface of the substrate, and the conformal spaces are etched to form spacers prior to the steps of implanting impurities at an angle.

In still another embodiment of the present invention, two sets of angled implants are utilized, the first angled implant may be at an angle of approximately 7°, and −7°, respectively, while a second implant may be at the angle 30°, and −30°, respectively.

In yet a further embodiment of the present invention, implants are utilized at an angle normal to the surface of the substrate and at an energy sufficient to penetrate the gate stack.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION OF THE PREFERRED EMBODIMENTS

Reference is now made to the figures for a description of the embodiments of the present invention. The invention comprises a unique method for providing an angled implantation and a self-aligned channel device with a unique method for manufacturing a channel device.

In the following description, numerous details, specific materials, process steps, and other parameters of the invention will be set forth in order to provide a thorough understanding of the present invention. It will be understood by one of average skill in the art that the specific details not presented herein need not be employed to practice the present invention and are not included in order to not unduly obscure the nature of the present invention.

Figure 1:
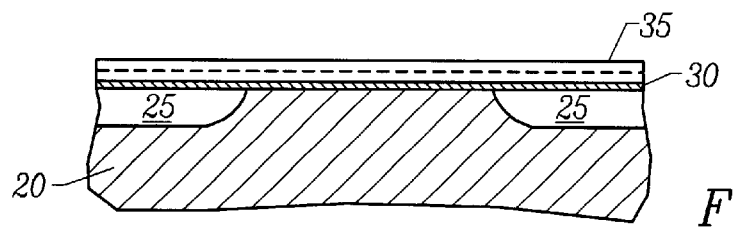
FIGS. 1–5 and 7 are cross-sections of a semiconductor substrate illustrating a first embodiment of the process of the present invention.

FIG. 1 shows a semiconductor substrate 20 having formed therein isolation regions 25 which may be formed by a typical local oxidation of silicon (LOCOS) or trench isolation process. Trench isolation processes are generally preferred where small transistor geometries are utilized since they are more accurate and it is easier to control the lateral growth of the isolation region. The gate oxide 30 is formed on the surface of semiconductor substrate 20. A polysilicon layer 35 is formed on the surface of gate oxide 30.

Gate oxide 30 is typically formed by placing substrate 20 in an oxygen-containing atmosphere and heating the substrate to form an oxide having a thickness of 1.5–5.0 nm.

Polysilicon layer 35 is formed by any number of conventional low pressure chemical vapor deposition processes. Thickness of the polysilicon layer will depend on the ultimate size of the device to be formed. In one embodiment, the thickness of the polysilicon layer may be about 15 to 20 nm.

Figure 2:
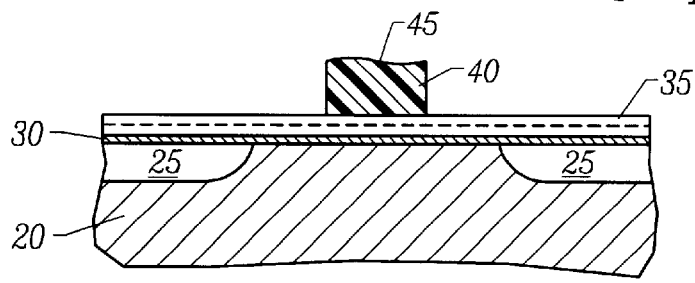
Figure 3:
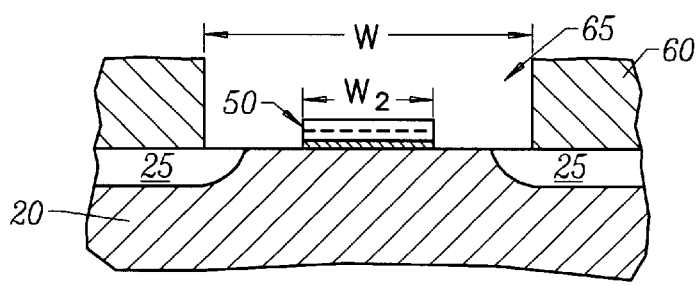

FIG. 2 shows a patterned photoresist mask layer 40 which has been deposited on top of polysilicon layer 35. A portion 45 of photoresist mask layer 40 remains on top of polysilicon layer 35 and will be used to form a gate stack 50 on substrate 20. The gate stack 50 is shown in FIG. 3 and results from etching polysilicon layer 35 and gate oxide layer 30 using a directional dry etch step in accordance with well-known techniques.

After formation of the gate stack, an implant photoresist mask 60 will be applied to the surface of substrate 20. Mask 60 may be any of a number of conventional photoresist mask layer chemistries patterned in accordance with well-known techniques. Implant mask 60 will have formed therein an implant window 65. The width W of the implant window will be dependent upon many factors, including the width $W_2$ of the gate structure 50, the height of the mask layer, and the ultimate size and characteristics of the device to be provided.

Figure 4:
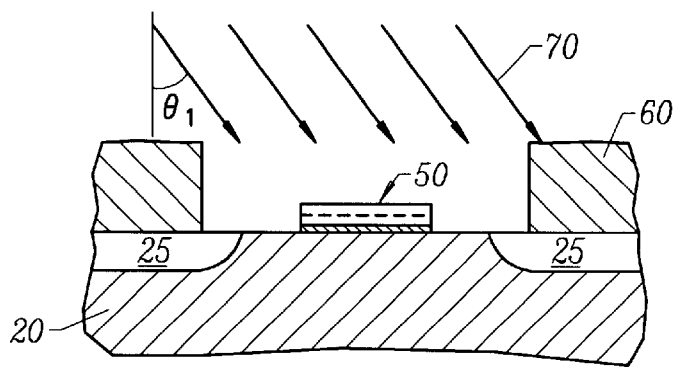

Subsequently, as shown in FIG. 4, a first implant 70 is made. Although the invention can be utilized to form both N-channel and P-channel devices, for an N-channel device, implant 70 may be, for example, an implant of boron at an energy of 25–70 KeV at an angle $\theta_1$ of 30° to yield a resulting concentration of $8 \times 10^{12}$ atm/cm$^2$. Angle $\theta_1$ may be in a range of about 7° to 40°.

Figure 5:
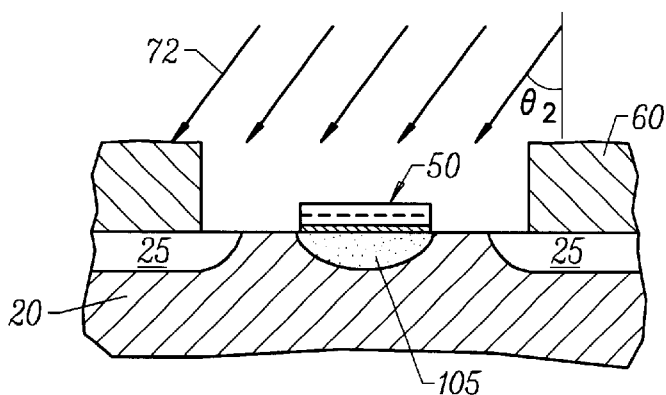

As shown in FIG. 5, a second implant 72 will be performed at an angle $\theta_2$ which may be 180° opposite of the implant direction of implant 70. Angle $\theta_2$ may be −30° and implant 72 may be, in one embodiment, an identical implant in energy and impurity except for the reversal of direction. That is, the second implant 72 will in one embodiment be a boron implant in a range of 25–70 KeV to yield an implant concentration of $8 \times 10^{12}$ to $1.5 \times 10^{13}$ atm/cm$^2$. Implant 72 may be performed by rotating the substrate 180° in the process chamber and repeating the implantation process used for implant 70.

Exemplary implants in a p-channel case would be of a phosphorous impurity at 200 KeV to yield an implant concentration of $10.5 \times 10^{12}$ atm/cm$^3$ at the 30 and −30° values for $\theta_1$ and $\theta_2$. The resulting structure is shown in FIG. 5 wherein the implants 70,72 yield an implanted region 105 in the eventual channel region of the device under formation. The angled implants utilized in the present application provide lower background doping in the source and drain area regions. As will be recognized by one of average skill in the art, the dopant concentrations in region 105 will control the threshold voltage $V_t$ of the resulting device under formation. For some threshold channel voltages, doping by angled implants in the manner of the present invention enables higher drain to source current on the order of 10–20% greater than a conventional LDD self-aligned transistor.

Figure 6:
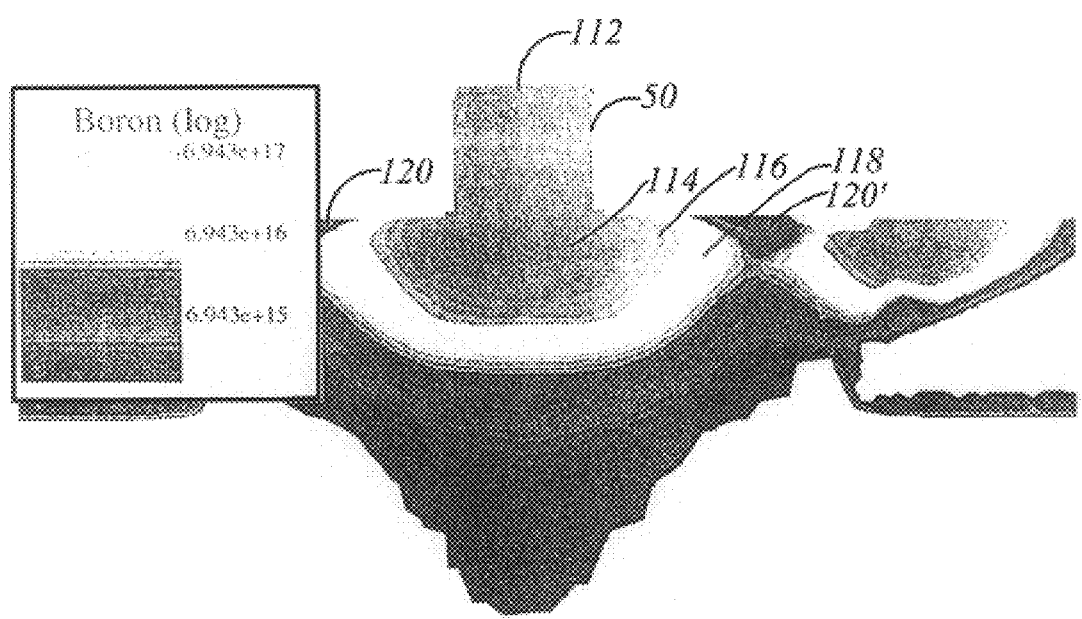
FIG. 6 is a cross-section spectrograph of a boron implant performed in accordance with a first embodiment of the method of the present invention.

FIG. 6 shows a simulated concentration crosssection diagram of a semiconductor structure, specifically an implant of boron into a gate structure 50 on a substrate 110 conducted in accordance with FIGS. 4 and 5. As seen in FIG. 6, the implant concentration of boron will be greatest in region 112 in the gate stack and just below the gate stack in region 114. The boron concentration decreases in region 116 until region 118 where the concentration reaches about $6.943 \times 10^{16}$ atm/cm$^3$. The mask layer 60 (not shown) provides low concentration in regions 120 where the angle of the implant from implant 70 as shown in FIG. 4 will be blocked by gate stack 50 (for region 120) and the mask layer 60.

Figure 7:
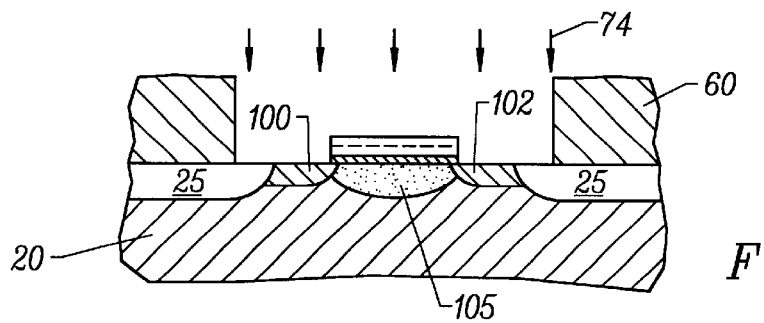

Subsequent to implant 72, as shown in FIG. 7, a direct implant 74, normal to the surface of substrate 20, will be performed to form source/drain regions 100,102 in a manner well known to one of average skill in the art. Implant 74 may be of an impurity such as arsenic at an energy of 2.5–25 KeV to form regions 100,102 having a concentration of $1.0 \times 10^{20}$ atm/cm$^3$–$1.5 \times 10^{20}$ atm/cm$^3$ at a junction depth of about 5–10 nm under the surface of substrate 20.

As should be recognized by one of average skill in the art, the orientation of the wafer, and the device represented in FIGS. 1–5 is but one device and one orientation of the substrate. Other devices, having a perpendicular or "vertical" orientation with respect to the page, may be provided for in the method of the present invention. Subsequent to the implant shown in FIG. 5, the substrate may be rotated 90° (or 270°) with respect to the orientation shown in the Figures and the mask step (shown in FIG. 3), and implants 70,72, repeated to form vertically oriented transistors.

Figure 8:
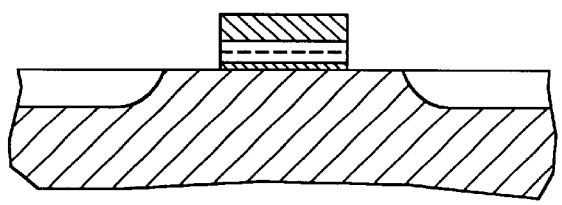
FIGS. 8–11 are cross-sections of a semiconductor substrate illustrating a second embodiment of the method of the present invention.
Figure 9:
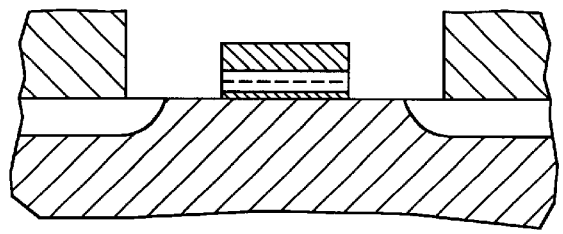
Figure 10:
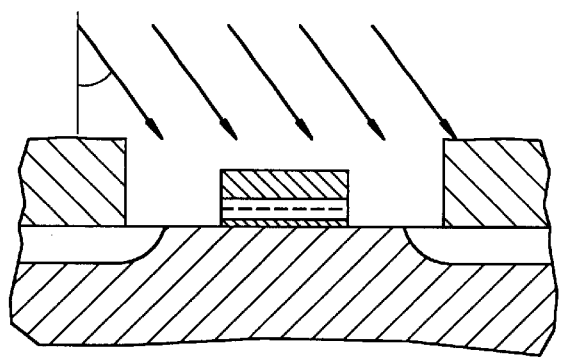
Figure 11:
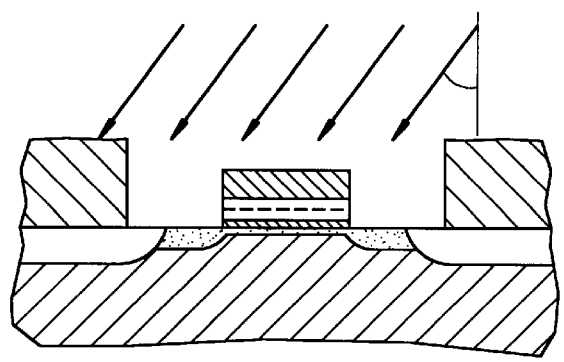

FIGS. 8–11 show an alternative embodiment for implementing the method and apparatus of the present invention. In FIG. 8, the gate stack 50 has formed thereon a layer of oxinitride or silicon nitride 55 having a thickness of about 100 nanometers. The oxinitride layer can be utilized for gate mask lithography in addition to the photoresist layer 40 shown in FIG. 2. As shown in FIGS. 9 and 10, the implants 70' and 72' may be performed in an identical fashion to implants 70 and 72, but the oxinitride layer 55 shields the gate stack from impurity penetration into the polysilicon gate region. The resulting concentration of the $V_t$ implant will be more limited in the region directly below the gate structure.

Figure 12:
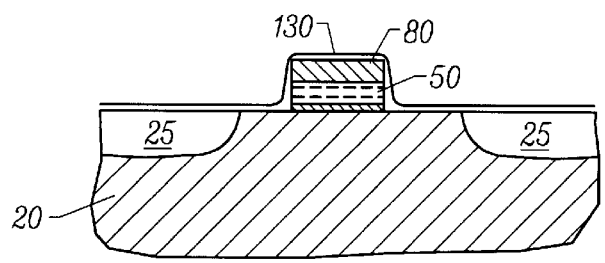
FIGS. 12–17 are partial cross-sections of a semiconductor substrate illustrating a third embodiment for forming the apparatus of the present invention in accordance with the method of the present invention.

FIGS. 12–17 show yet another embodiment of the present invention. Shown in FIG. 12 is the structure equivalent to that shown in FIG. 7 with gate stack 50 and an oxinitride layer 55 overlying the gate stack 50. A conformal layer of silicon nitride 130 may be deposited over the surface of substrate 20, gate stack 50 and oxinitride layer 80 by any of a number of well-known techniques.

Figure 13:
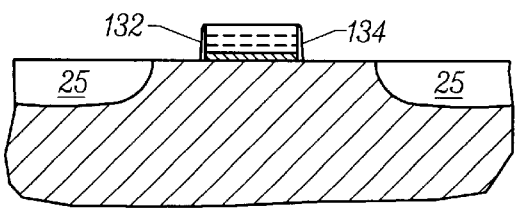

Subsequently, conformal layer 130 is etched to form spacers 132,134 by a directional dry etch process. The resulting structure is shown in FIG. 13. Etching of the silicon nitride layer 130 will remove oxinitride layer 55 and yield spacers 132,134 which are relatively thin.

Figure 14:
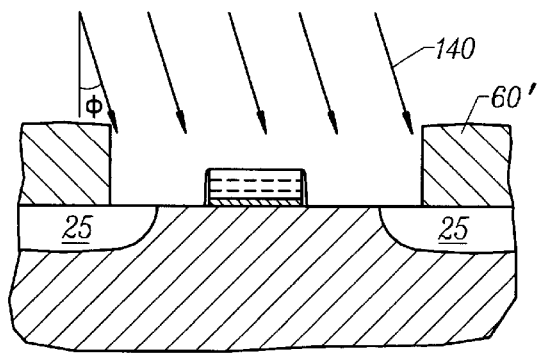
Figure 15:
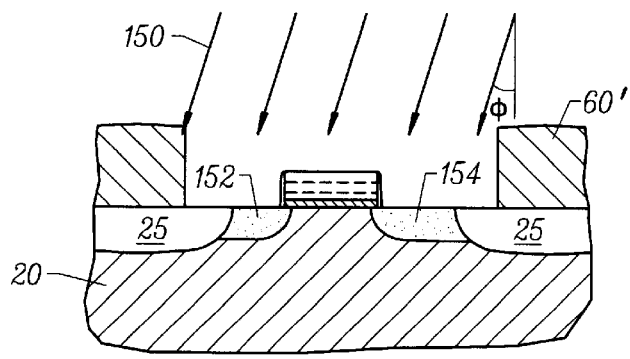

In accordance with this second embodiment of the invention, a total of four implants are utilized. FIG. 14 shows a first implant 140 of an impurity mask at an angle θ. First implant 140 may be at an angle θ of approximately 7° at an energy of about 100 KeV. A second implant 150 is made at an angle −θ of −7°. Both implants will be of boron ions at an energy of approximately 100 KeV to reach a concentration of approximately $5 \times 10^{12}$ atm/cm$^2$. This implant will form regions 152,154 at a junction depth of about 15–25 nm in substrate 20.

Figure 16:
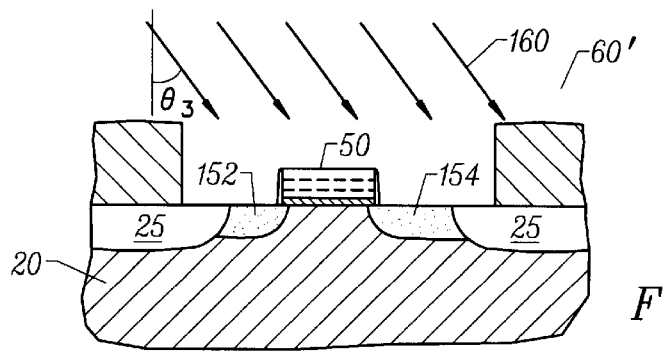
Figure 17:
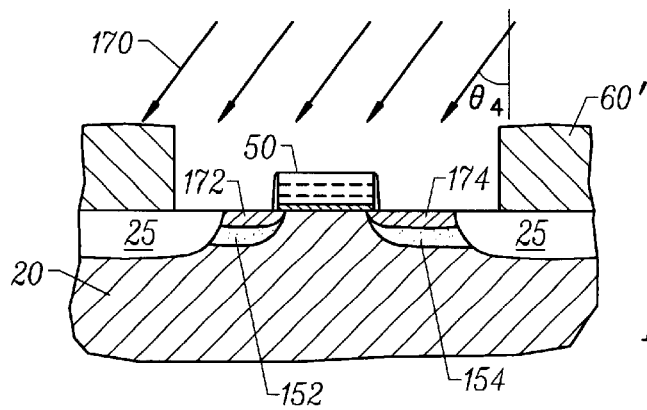

A third implant 160 and fourth implant 170 are shown in FIGS. 16 and 17. Third implant 160 will be at an angle $\theta_3$, while implant 170 shown in FIG. 17 will be at an angle $\theta_4$ which is equivalent to $-\theta_3$. The angles $\theta_3$ and $\theta_4$ may be in a range of 30–40°. This implant will be of an impurity such as boron, at an energy of about 20–40 KeV, to form regions 172,174 having a concentration of $1.0 \times 10^{13}$ atm/cm$^2$–$1.5 \times 10^{13}$ atm/cm$^2$ and a junction depth of about 5–10 nm in substrate 20. The tilt threshold adjust implants 140,150,160, 170, will determine the effective channel length and also the Miller capacitance of the device. Since a threshold adjust implant is much deeper in this case, the junction capacitance will be reduced by an even greater degree than the method shown in FIGS. 1–9. However, a higher punch-off current may be found in this embodiment of the present invention.

If implants 140,150,160,170 are to be in a p-channel device, arsenic may be used as the impurity at an energy of approximately 200–300 KeV.

It should be recognized that the height of the mask layers 60, and the width of the opening 65 will greatly depend and serve to control the implant which is utilized to control threshold voltage. In the present invention, no separate threshold voltage implants are required over that necessary to fulfill the source and drain regions in the transistor device of the present invention.

FIGS. 18–21 illustrate yet another embodiment of the present invention wherein an implant for adjusting the threshold voltage of the transistor under formation is specifically designed to penetrate the polysilicon gate of the transistor under formation. In this embodiment, in contrast to prior embodiments, a single high energy implant of the channel doping impurity is performed normal to the surface of the substrate, eliminating the need for multiple angled implants.

Figure 18:
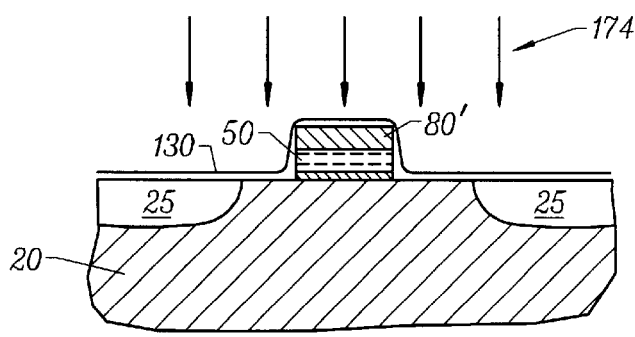
FIGS. 18–21 are partial cross-sections of a semiconductor substrate illustrating a fourth embodiment for forming an apparatus of the present invention.

FIG. 18 illustrates the semiconductor substrate 20 after processing in a manner equivalent to that shown in FIG. 12 wherein an oxinitride or other barrier layer has been formed over the gate stack, and a spacer layer formed over the gate stack and the oxinitride layer. It should be recognized that the method of the present invention does not require the use of the oxinitride layer nor the spacers, but each such use has advantages in the design of the semiconductor device. If, as shown in FIG. 18, the oxinitride remains on the gate stack 50 during the implant process, the energy of the implant will need to be significant in order to penetrate the stack and the oxinitride layer.

Figure 19:
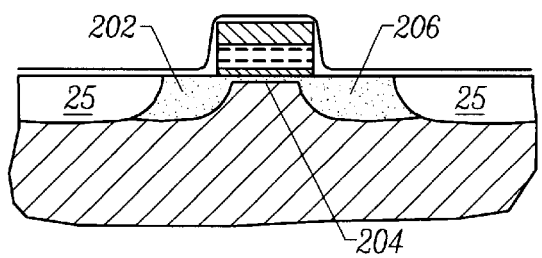

FIG. 18 also illustrates an implant 174 normal to the surface of the substrate which will form implant regions 202, 204, and 206 (shown in FIG. 19).

Implant 174 must be a relatively high energy implant in order for the dopant material to penetrate the gate stack 50 and oxinitride layer 80. For example, where the implant is of a boron type impurity for an n-channel device, the energy of the implant is on the order of 100 KeV, and for phosphorous, 300 KeV. With the oxinitride layer 80 in place, the implant will be significantly deep (to a junction depth on the order of 0.25–0.35 μm) to form regions 202, 206 in substrate 20, well below the channel region under gate stack 50. However, in region 204, under the gate stack 50, the dopant will remain in the region 204 adjacent to the gate stack (a junction depth of about 0.1 μm) to provide control over the threshold operation of the device being formed. Region 204 will have a dopant concentration of, for example, $5 \times 10^{17}$--$8 \times 10^{17}$ atm/cm$^3$ for boron and phosphorous.

Figure 20:
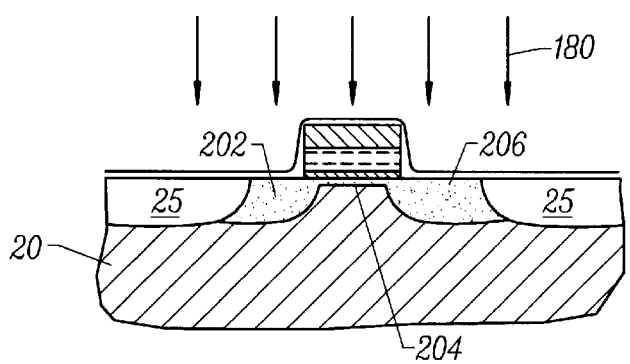
Figure 21:
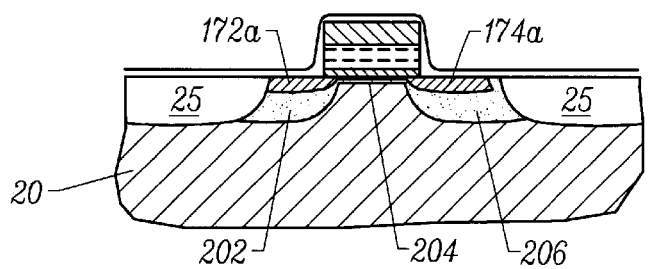

Subsequently, as shown in FIG. 20, a source/drain implant 180 is made at an angle normal to the surface of the substrate 20 to form source/drain regions 172a,174a, as shown in FIG. 21. Source/drain regions 172a,174a are relatively shallow, having a junction depth of about 0.03–0.06 μm and a concentration of $1 \times 10^{20}$ atm/cm$^3$, formed by an implant of, for example, arsenic ions implanted at an energy of 10 KeV. Because the source/drain regions are relatively shallow, and the deep implant regions 202, 206 are relatively deep, junction capacitance is substantially reduced over prior art devices.

The many features and advantages of the present invention will be apparent to one of average skill in the art. A number of alternative embodiments involving variations apparent to one of average skill in the art are contemplated as being incorporated into the present invention. By way of example and without limitation, the substrate may be rotated 90° or 270° with respect to the orientation shown in the figures, at a point subsequent to implant 72, and with formation of appropriate masks, angled implants may be utilized in the manner described in FIGS. 4–5, to form vertically oriented transistors on the substrate. Similarly, the embodiments of the method of the invention described with respect to FIGS. 7–10 may also employ subsequent rotation and implant steps. All such features, modifications, and advantages of the present invention are intended to be within the scope of the invention as defined by this specification and the attached claims.

What is claimed is:

1. A method for forming a semiconductor device on a semiconductor substrate having a surface, comprising the steps of:

(A) forming a gate stack on the substrate, the gate stack having a first side and a second side;

(B) forming a mask layer over the substrate, the mask layer having an opening over the gate stack and over a first and second portions of the substrate at the respective first and second side of the gate stack;

(C) implanting a first dose of an impurity into the gate stack and the substrate at a first angle relative to a line normal to the surface of the substrate greater than 7 degrees and less than 30 degrees;

(D) implanting a second dose of the impurity into the gate stack and the substrate at a second angle relative to a line normal to the surface of the substrate, the second angle being less than −7 degrees and greater than −30 degrees; and wherein the mask layer blocks at least a portion of said first dose and said second dose to a portion of the substrate at the first and second side of the gate stack;

wherein the impurity is boron and wherein the steps (C) and (D) provide an implant region having a graded concentration profile of about $7 \times 10^{17}$ atm/cm$^3$ concentration in the gate stack to about $6.9 \times 10^{15}$ atm/cm$^3$ in the substrate underlying the gate stack.

* * * * *